(12) United States Patent
Dalton et al.

(10) Patent No.: US 7,285,994 B2
(45) Date of Patent: Oct. 23, 2007

(54) ROTATIONAL FREQUENCY DETECTOR SYSTEM

(75) Inventors: Declan M. Dalton, Dooradoyle (IE); Lawrence M. DeVito, Tewksbury, MA (US); Mark Ferriss, Rochestown (IE); Paul Murray, Raheen (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/830,664

(22) Filed: Apr. 23, 2004

(65) Prior Publication Data

US 2005/0024094 A1     Feb. 3, 2005

Related U.S. Application Data

(60) Provisional application No. 60/490,649, filed on Jul. 28, 2003.

(51) Int. Cl.
*H03L 7/06* (2006.01)

(52) U.S. Cl. .......................................... 327/147; 327/12

(58) Field of Classification Search .................. 327/47, 327/146, 147, 154, 155, 162, 163, 12, 49; 331/1 A, 17, 25, DIG. 2; 375/373–376
See application file for complete search history.

(56) References Cited

U.S. PATENT DOCUMENTS

| 4,803,705 A | * | 2/1989 | Gillingham et al. | ......... 375/375 |
| 5,614,846 A | * | 3/1997 | Pontius | ................... 326/93 |
| 6,489,852 B1 | * | 12/2002 | Beaulieu | ................... 331/25 |

\* cited by examiner

*Primary Examiner*—Linh My Nguyen
(74) *Attorney, Agent, or Firm*—Iandiorio & Teska

(57) ABSTRACT

A rotational frequency detector system including a rotational frequency detector responsive to a data signal and a clock signal. The rotational frequency detector is configured to compare the frequency of the clock signal to the frequency of the data signal to define frequency up and frequency down signals that adjust the frequency of the clock signal to be equal to the frequency of the data signal. A step control system is responsive to the rotational frequency detector and a step clock signal and is configured to define predetermined pulse widths for the frequency up and frequency down signals.

23 Claims, 17 Drawing Sheets

ROTATIONAL FREQUENCY DETECTOR SYSTEM

RELATED APPLICATIONS

This application claims priority of U.S. Provisional Application No. 60/490,649 filed Jul. 28, 2003, incorporated by reference herein.

FIELD OF THE INVENTION

This invention relates to an improved rotational frequency detector system typically employed in the frequency locked loop of a clock and data recovery circuit.

BACKGROUND OF THE INVENTION

A fiber optic communications link typically includes a transmitter to transmit and direct through a fiber optic cable light emitted from a laser diode. At the receiving end of the fiber optic cable the light is detected by a photo detector and converted into an electrical current. The current is converted to voltage by a transimpedance amplifier and then amplified by a limiting amplifier. The amplified voltage signal is applied to a clock and data recovery circuit which extracts a clock signal from the received data (i.e., a recovered clock signal) and acquires the frequency of the incoming data by comparing the frequency of the recovered clock signal to the frequency of the incoming data signal.

Frequency acquisition is performed with a frequency lock loop (FLL) circuit which typically includes a frequency detector, a charge pump, a loop filter, a voltage controlled oscillator (VCO) and a digital divider.

One typical implementation of the frequency detector is a rotational frequency detector (RFD). The RFD locks the frequency of the recovered clock signal ($f_{VCO/N}$) to the frequency of the incoming data signal by comparing transitions of the data signal to transitions of the recovered clock signal to determine if the frequency of the recovered clock signal ($f_{vco/N}$) needs to be increased or decreased. The RFD then generates the appropriate frequency up or frequency down signals (or pulses) which are applied to the charge pump. The charge pump adds or removes charge to or from the loop filter which applies an increase or decrease in the voltage to the VCO. The VCO then increases or decreases its output frequency proportional to the amount of voltage applied to it, known as the frequency step size. The time required to lock the frequency of the recovered clock to the incoming data is known as acquisition time.

Prior art RFDs produce frequency up and frequency down pulses whose width is equal to one period of the recovered clock, i.e., $f_{VCO/N}$. Because the frequency of the input data signal can vary significantly in wide band applications, the value of N generated by the digital divider (e.g., between 1 and 256) also varies with the changes in frequency, e.g., at high frequencies, N is lower. The result is the pulse width of the frequency up and frequency down signals generated by prior art RFDs also varies directly with the changes in N. Therefore, at low values of N, the pulse width of the frequency up or frequency down signals produced by these prior art RFDs is very small which overworks the charge pump requiring a higher speed and more complex design of the charge pump. Moreover, the resulting narrow pulse width frequency up signals and frequency down signals applied to the charge pump result in a very small frequency step size produced by the VCO which increases acquisition time of the frequency locked loop (FLL).

Another drawback associated with prior art RFDs is that the operating range of the normalized frequency error of these RFDs is between −37% to +50%. If the frequency difference between the incoming data and the recovered clock is outside these limits, the RFD will not function correctly and will not force the frequency of the recovered clock ($f_{VCO/N}$) to be equal to the frequency of the data. Although in some applications this is not a problem, as the circuit may be designed to be centered at the expected data frequency and varies little around that point, in other applications, such as wide-band applications, this is unacceptable.

Yet another drawback of conventional RFDs is that when the normalized frequency error is less than approximately −50% no output is produced which results in a condition that is indistinguishable from a true lock. This can result in a false lock condition. Also in frequency locked loops which employ RFDs, a residual frequency error exists between the recovered clock signal ($f_{VCO/N}$) and the incoming data signal when the loop has settled. In frequency locked loops which employ conventional RFDs, this residual frequency error is a function only of the charge pump current and the leakage current at the loop filter node.

SUMMARY OF THE INVENTION

It is therefore an object of this invention to provide an improved rotational frequency detector system.

It is a further object of this invention to provide such an improved rotational frequency detector system which eliminates the need to rely on the frequency of a recovered clock to define the pulse width for frequency up and frequency down signals.

It is a further object of this invention to provide such an improved rotational frequency detector system which provides controlled and predetermined pulse widths for the frequency up and the frequency down signals.

It is a further object of this invention to provide such an improved rotational frequency detector system which generates frequency up and frequency down signals having a constant pulse width independent of variations of the incoming data.

It is a further object of this invention to provide such an improved rotational frequency detector which generates a fixed frequency step size in response to a frequency up or frequency down signal.

It is a further object of this invention to provide such an improved rotational frequency detector system which increases the operating range of the normalized frequency error.

It is a further object of this invention to provide such an improved rotational frequency detector system which eliminates false locking.

It is a further object of this invention to provide such an improved a rotational frequency detector system which decreases acquisition time.

It is a further object of this invention to provide such an improved rotational frequency detector system which decreases residual frequency errors when the FLL loop has settled.

The invention results from the realization that a truly innovative rotational frequency detector system can be achieved by providing a step clock signal which is used to generate frequency up and frequency down signals having predetermined fixed pulse widths or pulse widths which are dependent on but not equal to the period of the recovered clock signal ($f_{VCO/N}$).

This invention features a rotational frequency detector system including a rotational frequency detector responsive to a data signal and a clock signal. The rotational frequency detector is configured to compare the frequency of the clock signal to the frequency of the data signal to define frequency up and frequency down signals that adjust the frequency of the clock signal to be equal to the frequency of the data signal. A step control system is responsive to the rotational frequency detector and a step clock signal. The step control system is configured to define predetermined pulse widths for the frequency up and frequency down signals.

In one embodiment, the step control system may include a step clock for generating the step clock signal independent of the clock signal. The predetermined pulse widths of the frequency up and the frequency down signals may be equal to the period of the step clock signal. The step control circuit may include a frequency divider circuit connected to the output of a voltage controlled oscillator of a phase lock loop circuit and/or a frequency lock loop circuit to generate the step clock signal as a function of the frequency of the voltage controlled oscillator divided by a predetermined number. The step control circuit may include a frequency divider circuit connected to a digital divider circuit of a phase lock loop circuit and/or frequency lock loop circuit and may generate the step clock signal as a function of the frequency of the voltage controlled oscillator divided by N times a predetermined number. The rotational frequency detector may include a first plurality of storage devices clocked by a transition of the data signal, a second plurality of storage devices clocked by a transition of the clock signal, and an indicator circuit configured to generate intermediate frequency up and frequency down signals. The plurality of storage devices may include D-type flip-flops. The indicator circuit may include a plurality of AND gates. The step control system may include a plurality of storage devices and a detection circuit responsive to the intermediate frequency up and frequency down signals and the step clock signal configured to generate the frequency up signals and the frequency down signals having the predetermined pulse widths. The one or more of the plurality of storage devices may be clocked by the intermediate frequency up and frequency down signals. The one or more of the plurality of storage devices may be clocked by the step clock signal. The storage devices of the step control system may include D-type flip-flops. The detection circuit may include an OR gate. The rotational frequency detector may include a first plurality of storage devices and a second plurality of storage devices clocked by a transition of the input data signal and a detection circuit configured to generate intermediate frequency up and frequency down signals. The step control system may include a plurality of storage devices and a detection circuit responsive to the intermediate frequency up signal and frequency down signals and the step clock signal configured to generate the frequency up and frequency down signals having a predetermined pulse widths. One or more of the plurality of storage devices may be clocked by the intermediate frequency up and frequency down signals. One or more of the plurality of storage devices may be clocked by the step clock signal. The step control system may further include a lock out circuit configured to remove false frequency up signals and false frequency down signals. The lock out circuit may include a plurality of AND gates. The rotational frequency detector system may operate in a range of about −50% to +50% of the normalized frequency error of the rotational frequency detector. The rotational frequency detector system may generate a non-zero output below −50% of the normalized frequency error of the rotational frequency detector.

This invention further features a rotational frequency detector system with independent clock control including a rotational frequency detector responsive to a data signal and a clock signal. The rotational frequency detector compares the frequency of the clock signal to the frequency of the data signal to define frequency up and frequency down signals that adjust the frequency of the clock signal to be equal to the frequency of the data signal. The rotational frequency detector system also includes a step control system responsive to the rotational frequency detector and a step clock signal configured to define predetermined pulse widths for said frequency up and the frequency down signals which are independent of the clock signal.

This invention also features a rotational frequency detector system including a rotational frequency detector responsive to a data signal and a clock signal configured to compare the frequency of the clock signal to the frequency of the data signal to define frequency up and frequency down signals that adjust the frequency of the clock signal to be equal to the frequency of the data signal. A step control system is responsive to the rotational frequency detector and includes a step clock configured to generate a step clock signal independent of the clock signal which defines pulse widths for the frequency up and frequency down signals which are equal to the period of the step clock signal.

This invention further features a rotational frequency detector system including a step control system responsive to the rotational frequency detector and a step clock signal configured to define predetermined pulse widths for frequency up and frequency down signals which are equal to the period of the step clock signal.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
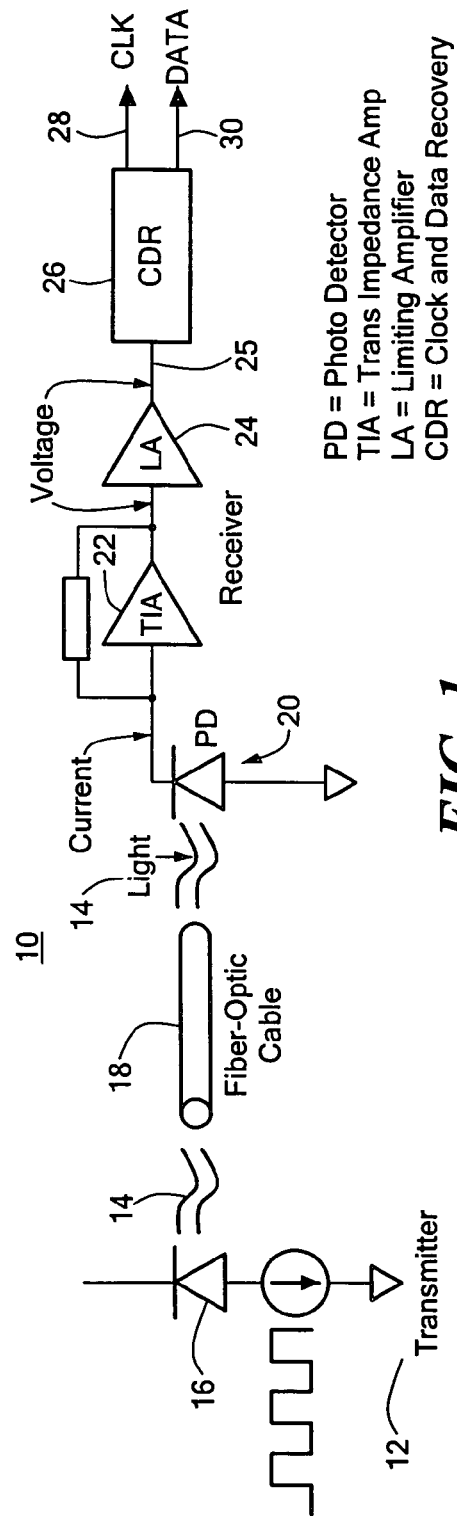
FIG. 1 is a schematic block diagram of a typical fiber optic communications link.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

As discussed in the Background section above, fiber optic communications link 10, FIG. 1 typically includes transmitter 12 to transmit and direct light 14 emitted from laser diode 16 through fiber optic cable 18. At the receiving end of fiber optic cable 18 light 14 is detected by photodetector 20 which converts light 14 into an electrical current. The current is converted to a voltage by transimpedance amplifier 22 and then amplified by limiting amplifier 24. The limited and amplified signal on line 25 is then applied to clock and data recovery circuit 26 which extracts a clock signal on line 28 and a data signal on line 30.

Figure 2:
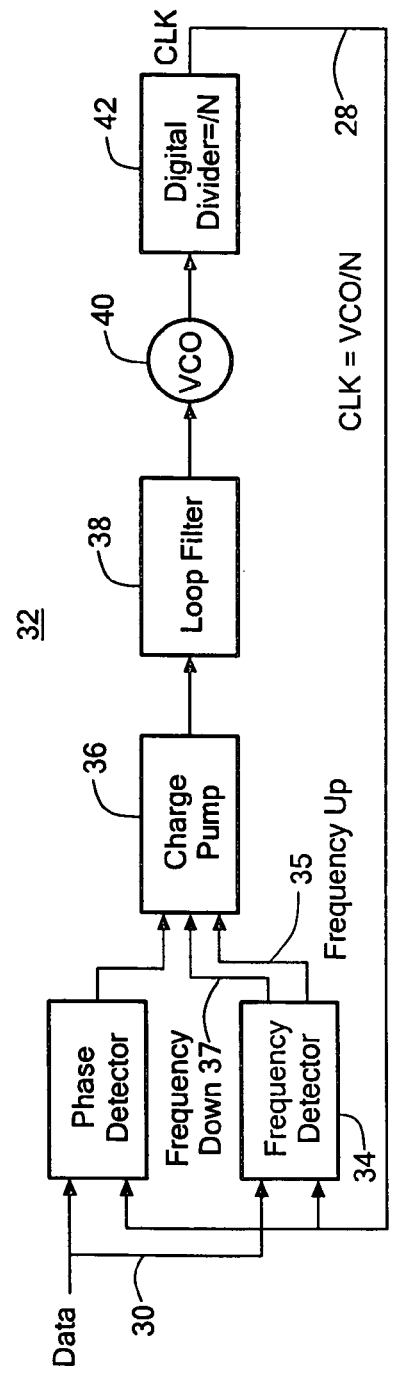
FIG. 2 is a schematic block diagram showing the primary components of a typical clock and data recovery circuit.

Frequency lock or acquisition is typically achieved with a frequency lock loop (FLL) circuit, such as FLL circuit 32, FIG. 2. FLL circuit 32 may include frequency detector 34, which generates a frequency up signal on line 35 and a frequency down signal on line 37. FLL circuit 32 also includes charge pump 36, loop filter 38, voltage controlled oscillator (VCO) 40, and in some designs digital divider 42 which, as described above, operates in response to the frequency up and frequency down signals produced by frequency detector 34 to adjust the frequency of a recovered clock signal on line 28 to be equal to the frequency of incoming data signal on line 30. One implementation of frequency detector 34 is a rotational frequency detector.

Figure 3:
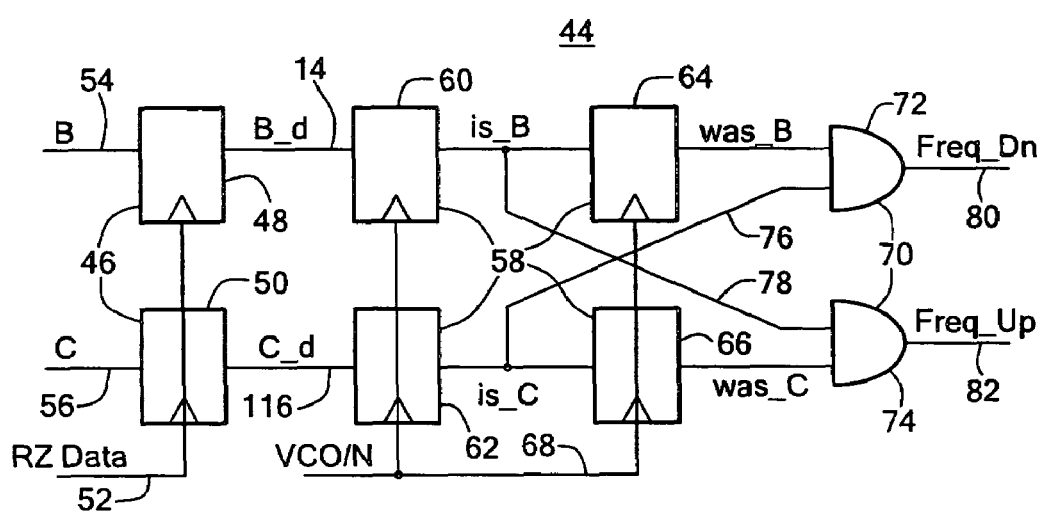
FIG. 3 is a schematic block diagram of a prior art rotational frequency detector.

Prior art rotational frequency detector (RFD) 44, FIG. 3 may include a first plurality of storage devices 46, e.g., flip-flops 48 and 50, clocked by transitions of incoming data on line 52. First plurality of storage devices 46 are also responsive to B-quadrant clock signal on line 54 and C-quadrant clock signal on line 56. Second plurality of storage devices 58, e.g., flip-flops 60, 62, 64 and 66 are clocked by the clock signal on line 68 which has a frequency equal to $f_{VCO/N}$. A plurality of detection devices 70, e.g., AND gates 72 and 74, are responsive to second plurality of storage devices 58 and generate frequency down signals on line 80 and frequency up signals on line 82 which have pulse widths equal to the period of the recovered clock signal, $f_{vco/N}$, on line 68, e.g., $T_{VCO/N} \times N$.

Figure 4:
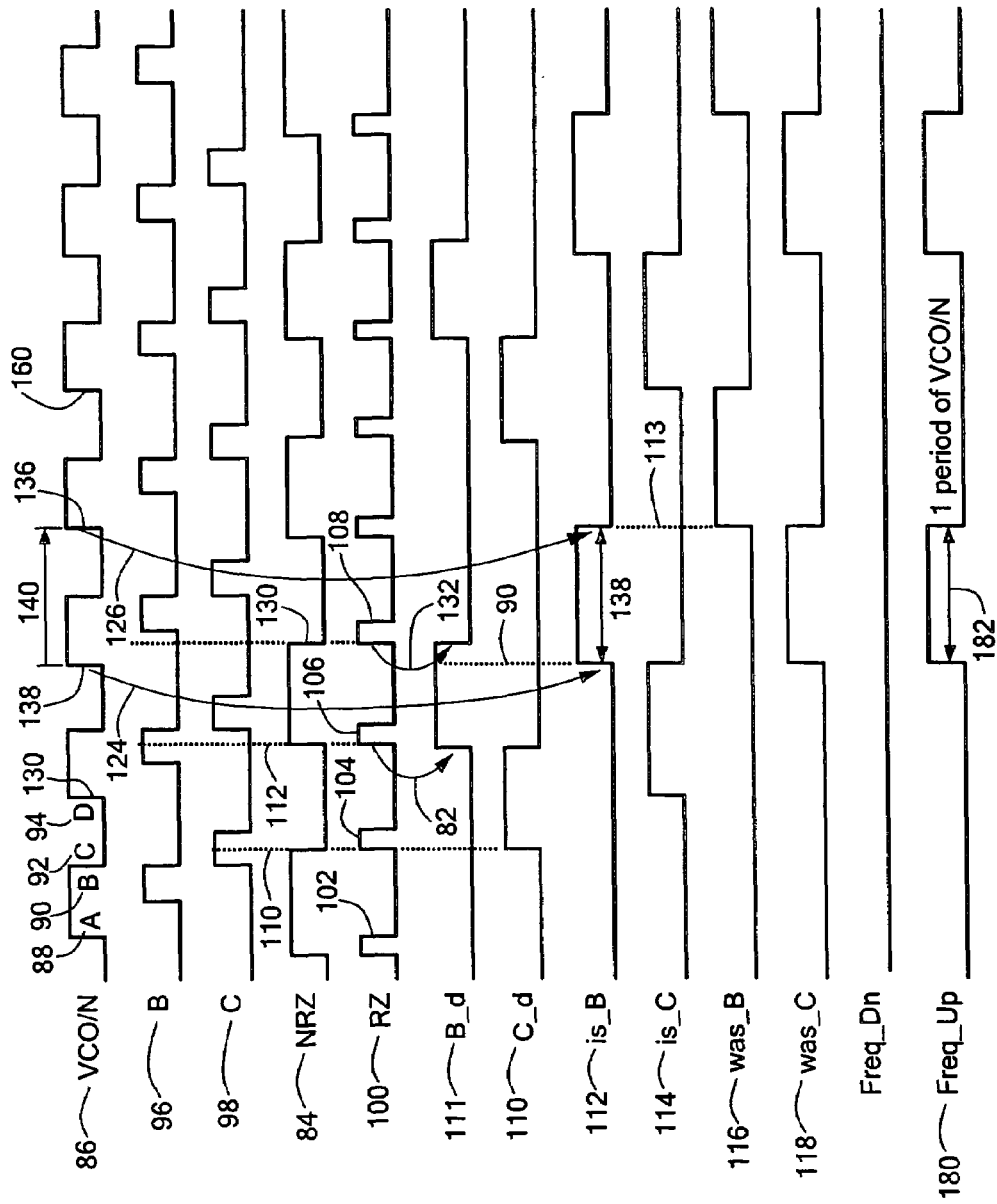
FIG. 4 is a timing diagram for the prior art rotational frequency detector shown in FIG. 3.

The operation of prior art RFD 44, FIG. 3 is now described with reference to the timing diagram shown in FIG. 4. RFD 44 compares the frequency of incoming data signal 84 (e.g., non-return to zero (NRZ) type data) to the frequency of recovered clock signal 86 by dividing recovered clock signal 86 into four quadrants A, B, C, D as indicated at 88, 90, 92, and 94. Typically, RFD 44 samples B-recovered quadrant clock signal 96 and C-recovered quadrant clock signal 98 with pulses of RZ data signal 100, e.g., pulses 102, 104, 106 and 108 which are generated for each rising and falling transition of NRZ data signal 84. For example, pulses 104 and 106 are used to sample and register C-quadrant clock signal 98 and B-quadrant clock signal 96, as indicated by dashed lines 110 and 112, respectively, in storage devices 50 and 48 as C_d signal 110 (the sampled C-quadrant signal) and B_d signal 111 (the sampled B-quadrant signal) on lines 116 and 114, respectively.

As shown above, pulses of RZ data signal 100 are used to sample B-recovered quadrant clock signal 96 and C-recovered quadrant clock signal 98 of recovered clock signal 86.

At this point, prior art RFD 44 is designed to hand over clock control to $f_{VCO/N}$ clock signal 86, as shown by arrows 124 and 126.

Prior art RFD 44 then registers B_d signal 111 as is_B signal 112 and registers C_d signal 110 as is_C signal 114 based on rising transitions of $f_{VCO/N}$ clock 86, e.g., transitions 134 and 136 are used to clock is_B signal 112 which has a pulse width, indicated by arrow 138, which is equal to the period of $f_{VCO/N}$ clock 86, indicated by arrow 140. Similarly, was_B signal 116 (the stored value of quadrant clock signal B one cycle earlier) and was_C signal 118 (the stored value of quadrant clock signal C one cycle earlier) are registered based on rising transitions of $f_{VCO/N}$ clock 86. Is_B signal 112, was_B signal 116, is_C signal 114 and was_C signal 118 are stored and propagated through storage devices 60, 62, 64 and 66 (e.g., D-type flip-flops) and detection devices 70 and 74 (e.g., AND gates) and generate the appropriate frequency up signals on line 82 and frequency down signals on line 80 which have pulse widths equal to $f_{VCO/N}$ clock 86. In this example, the frequency of data signal 84 is greater than the frequency of clock signal ($f_{VCO/N}$) 86, and frequency up signal 180 is generated. As indicated by arrow 182, the pulse widths of frequency up signal 180 is equal to the period of clock signal 86, as indicated by arrow 140. Similarly, although not shown in this example, prior art RFD 44 generates frequency down signals which have pulse widths equal to the period of $f_{VCO/N}$ clock signal 86. As discussed above in the Background section, producing frequency up or frequency down signals with pulse widths equal to the period of recovered clock signal 86 at frequency of $f_{vco/N}$ results in frequency up and frequency down signals which have pulse widths which vary directly with changes in N. For small values of N, e.g., N=1, the resulting pulse widths of the frequency up and frequency down signals can be very narrow (e.g., $T_{vco}$) which results in a more difficult design for the charge pump.

Figure 5A:
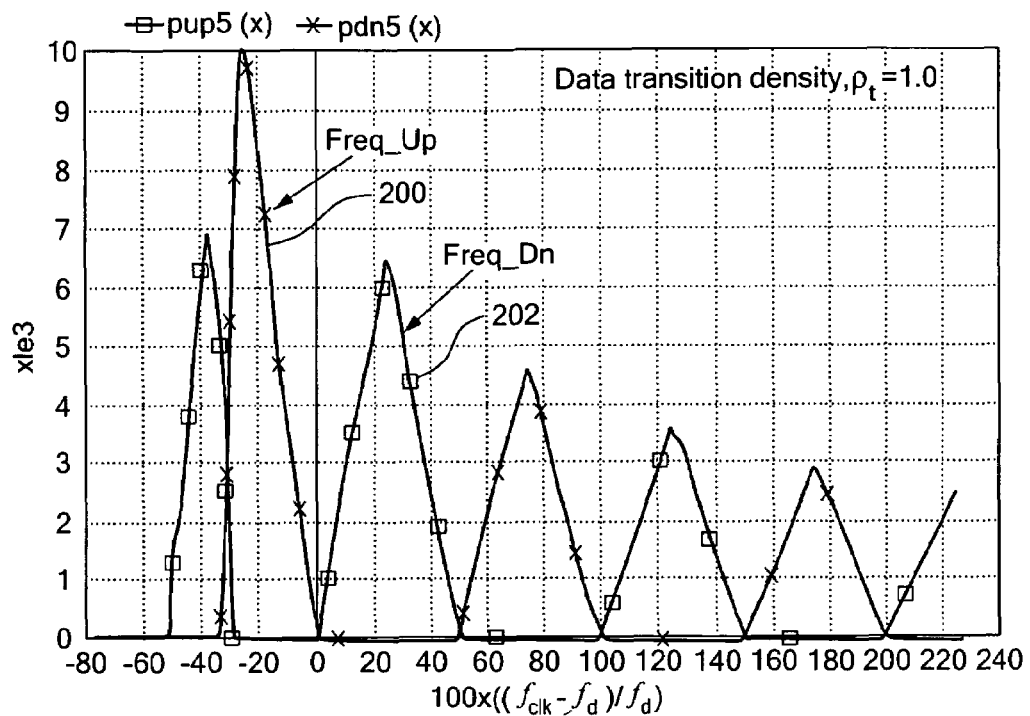
FIGS. 5A, 5B, 5C, and 5D are graphs showing the transfer function of the prior art rotational frequency detector shown in FIG. 3.
Figure 5B:
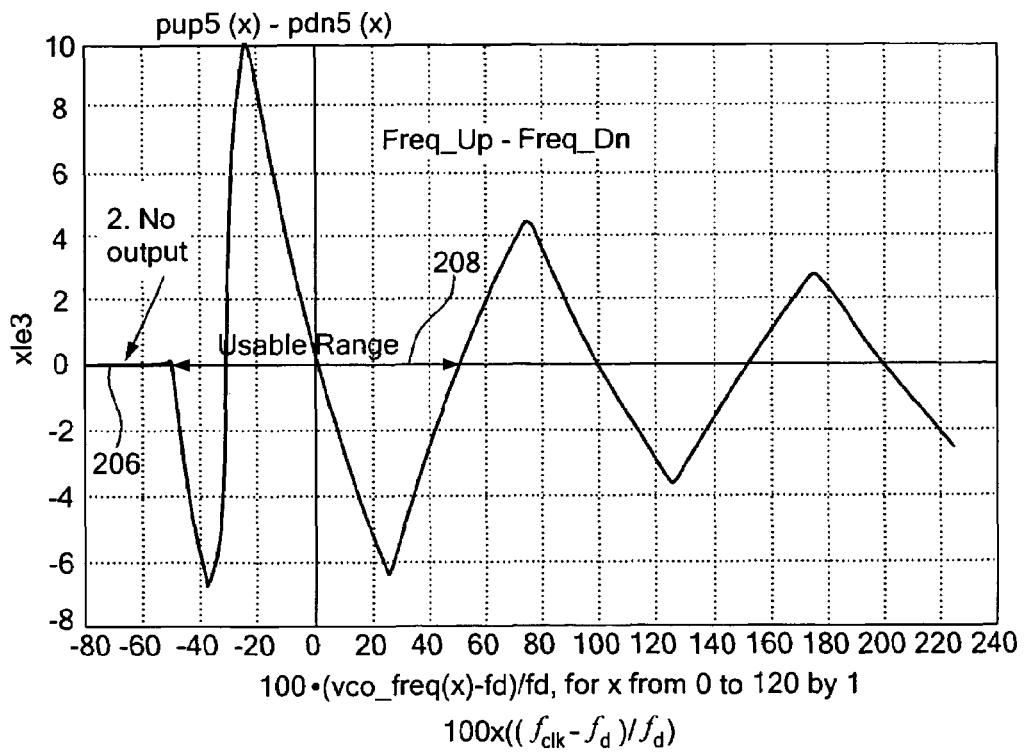

FIG. 5A shows an example transfer function for prior art RFD 44, FIG. 3. The transfer function shown is an example when the input data has a data transition density, $\rho_t$, equal to 1.0. This corresponds to an input data signal with a transition at every bit period, e.g., 0101010, and the like. Graph 200, FIG. 5A shows the transfer function for the frequency up signals generated by RFD 44 and graph 202 shows the transfer of function of the frequency down signals. FIG. 5B shows a graph of the difference between the frequency up and frequency down graphs 200 and 202 shown in FIG. 5A. As shown in FIG. 5B, at frequencies less than about −50% prior art RFD 44 cannot produce any frequency up or frequency down signals, as indicated by arrow 206. The usable frequency range of prior art RFD 44 is between about −37% and about +50%, as indicated by arrow 208.

Figure 5C:
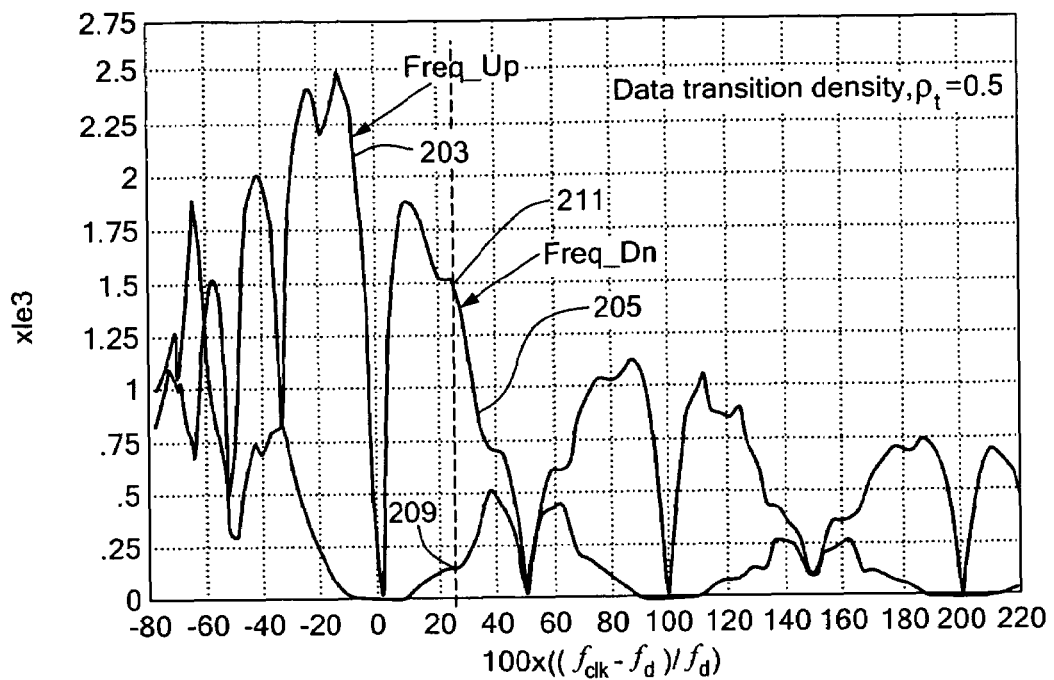
Figure 5D:
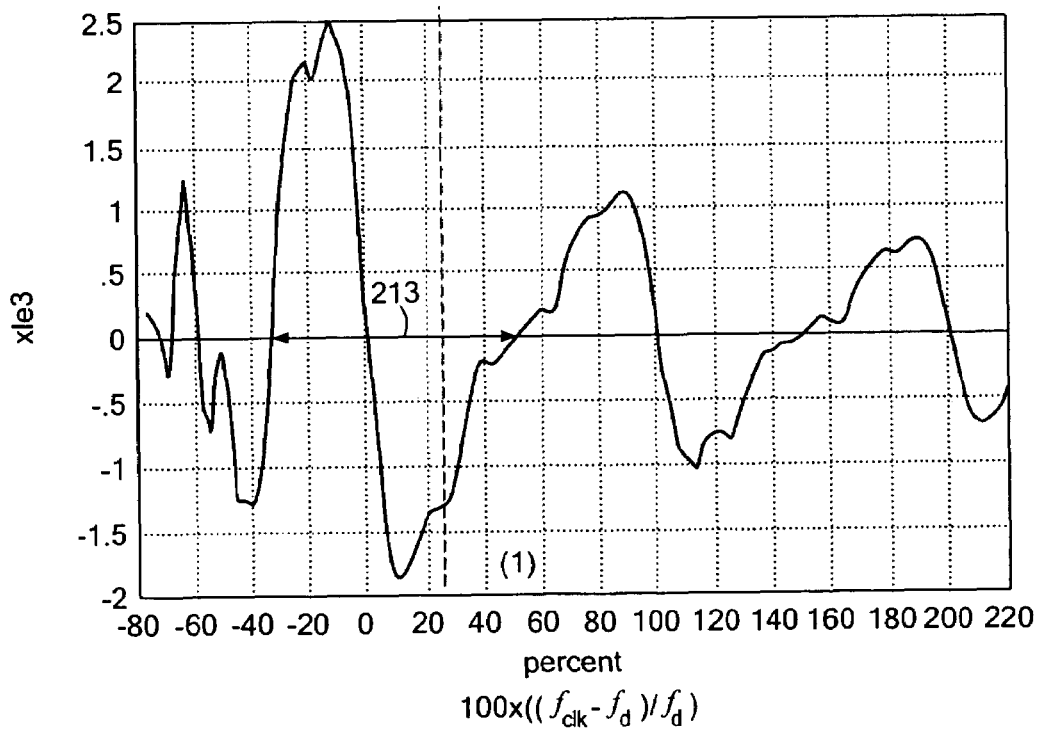

FIG. 5C shows an example of the transfer function prior art RFD 44 wherein the input data is random with a corresponding data transition density, $\rho_t$, equal to 0.5. In this example, graph 203 shows the transfer function for the frequency up signals generated by prior art RFD 44 and graph 205 shows the transfer function of the frequency down signals. FIG. 5D shows the difference between the frequency up and frequency down signals shown in FIG. 5C. As shown in FIG. 5C there are some false pulses in the transfer function when the data transition density, $\rho_t$=0.5 (i.e., random data). For example, at a normalized frequency error of +25%, prior art RFD 44 should ideally only produce frequency down pulses, as indicated at 211. However, as indicated at 209, some false frequency up signals are generated. This is not a problem, as there are still more valid frequency down pulses (indicated at 211) than frequency up pulses (indicated at 209).

Figure 6:
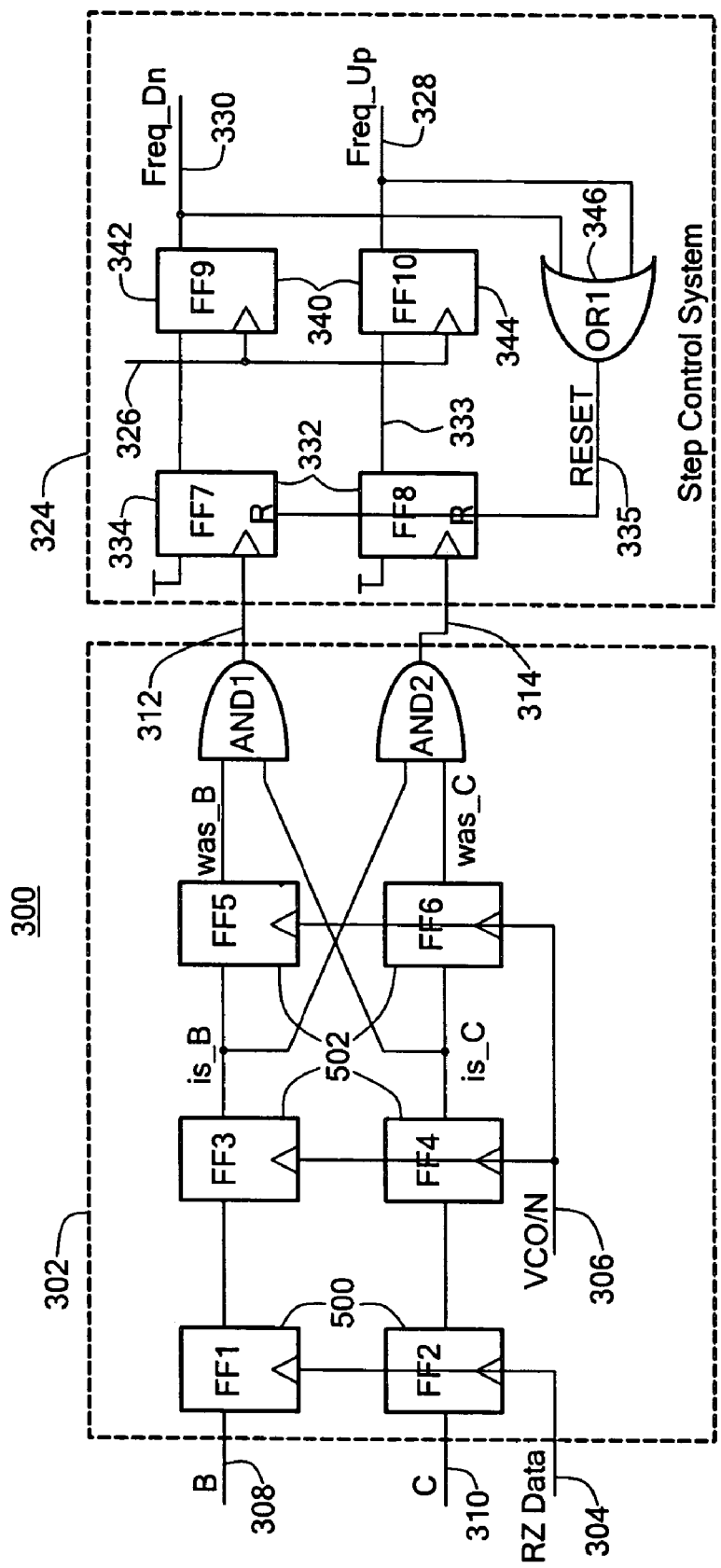
FIG. 6 is a schematic block diagram showing one embodiment of the rotational frequency detector system of this invention.

Rotational frequency detector system 300, FIG. 6 of this invention includes rotational frequency detector (RFD) 302 responsive to a data signal on line 304 and a recovered clock signal ($f_{VCO/N}$) on line 306. RFD 302 is of similar design as prior art RFD 44, FIG. 3, and similar to the prior art RFD 44 described above, RFD 302, FIG. 6, compares the frequency of the recovered clock signal ($f_{VCO/N}$) on line 306 to the frequency of the data signal on line 304 by sampling a B-quadrant clock signal on line 308 and a C-quadrant clock signal on line 310. RFD 302 generates an intermediate frequency down signal on line 312 and an intermediate frequency up signal on line 314, which, similar to the prior art RFD discussed above, have pulse widths which are equal to the period of the recovered clock signal, e.g., $T_{VCO} \times N$. For example, intermediate frequency up signal 350, FIG. 7, has a pulse width which is equal to one period of the recovered clock signal 318, as indicated by arrows 320 and 322.

In order to overcome the problems associated with the frequency up and frequency down signals which have pulse widths equal to the period of the recovered clock RFD, system 300, FIG. 6, of this invention includes step control system 324 responsive to the intermediate frequency down signal on line 312 and the intermediate frequency up signal on line 314. Step control system 324 generates a step clock signal on line 326 which is used to define the pulse widths for the frequency up signal on line 328 and the frequency down signal on line 330 which is equal to the period of the step clock signal or a multiple of it. The frequency up signal on line 328 and the frequency down signal on line 330 are used to adjust the frequency of the clock signal on line 306 to be equal to the frequency of the data signal on line 304 and achieve a frequency lock.

Step control system 324 includes a first plurality 332 of storage devices, e.g., D-type flip-flops 334 and 336, which are clocked by the intermediate frequency down signal on line 312 and the intermediate frequency up signal on line 314. Step control system 324 also includes a second plurality of storage devices 340, e.g., flip-flops 342 and 344, which are clocked by the step clock signal on line 326. Detection circuit 346 (e.g., an OR gate) is responsive to plurality of storage devices 340 and resets first plurality of storage devices 332 to a logic low to define frequency down signals on line 330 and frequency up signals on line 328 which have pulse widths equal to the period of the step clock signal on line 326.

Figure 7:
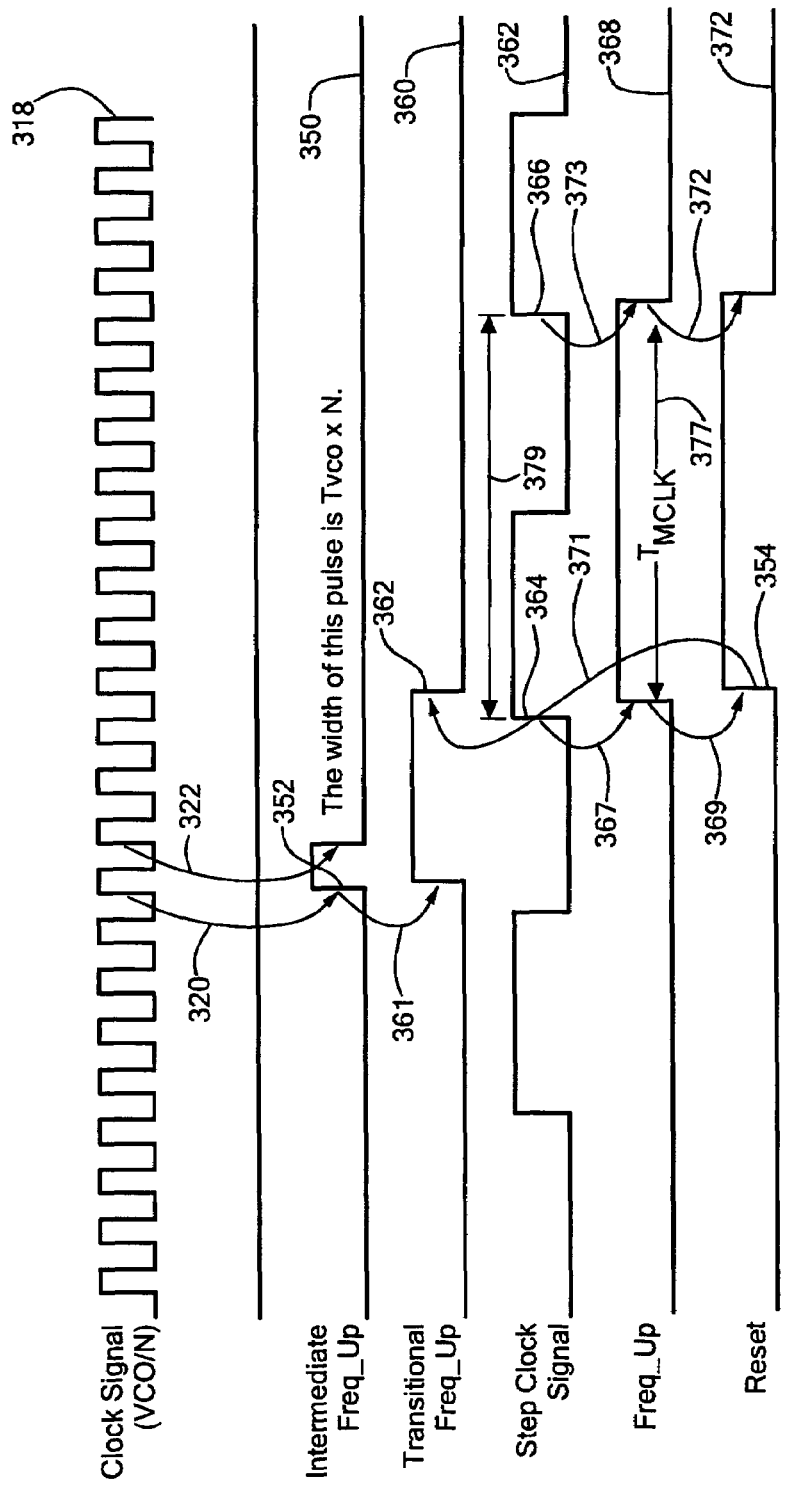
FIG. 7 is a timing diagram of the rotational frequency detector system shown in FIG. 6.

The operation of step control system 324 of RFD 300 of this invention is described below in reference to the timing diagram shown in FIG. 7. In this example, a transition of clock signal 318 indicated by arrow 320, clocks intermediate frequency up signal 350 to storage device 336, FIG. 6, on line 314. A rising transition of intermediate frequency up signal 350, FIG. 7, such as rising transition 352 registers transitional frequency up signal 360, indicated by arrow 361, to storage device 336 (e.g., FF8). A rising transition of step clock signal 362, FIG. 7, e.g., transition 364 registers a logic high, indicated by arrow 376, to storage device 344 (e.g., FF10). The logic high on line 328 enables detection device 346 (e.g., an OR gate) to generate a logic high on line 335 which resets storage device 336 (e.g., FF8) as indicated by arrow 371, FIG. 7. This resets the transitional frequency up signal on line 333, FIG. 6, to a logic low. On the next rising transition of step clock signal 362, e.g., transition 366, the reset transitional frequency up signal on line 333 is registered and propagated through storage device 344 (e.g., FF10) as a logic low on line 328 which generates a frequency up signal on line 328 which has a pulse width equal to one period of the step clock signal on line 326. As shown in FIG. 7, rising transition 366 of step clock signal 362 resets frequency up signal 368 to a logic low, as indicated by arrow 373, and resets reset signal 372 to a logic low as indicated by arrow 372. The result is that frequency up signal 368 has a pulse width, indicated by arrow 377, which is equal to the period of step clock signal 362, indicated by arrow 379. Similarly, although not described in this example, step control system 324 generates frequency down signals on line 330 which have pulse widths equal to the period of the step clock signal on line 326 and utilizes storage devices 334, 342 and detection circuit 346 in a similar fashion as described above.

As shown above, RFD system 300 of this invention with step control system 324 produces frequency up and frequency down signals which have pulse widths which are equal to the period of the step clock signal. Because the pulse widths of frequency up and frequency down signals are not derived from a clock signal with a frequency equal to $f_{vco/N}$ as found in the prior art, RFD system 300 of this invention provides fixed frequency step sizes across all data rates. The frequency up and frequency down signals do not vary with changes in N created from changes in frequency of the incoming data. By selecting a step clock signal with a period which is larger than the period of the recovered clock ($f_{vco/N}$) in accordance with this invention, the problems associated with narrow pulse width frequency up and frequency down signals which overwork the charge pump are eliminated. Moreover, the appropriate selection of the period of the step clock signal can lead to a reduction in acquisition time and a reduction in the residual frequency error when the loop has settled.

Figure 8:
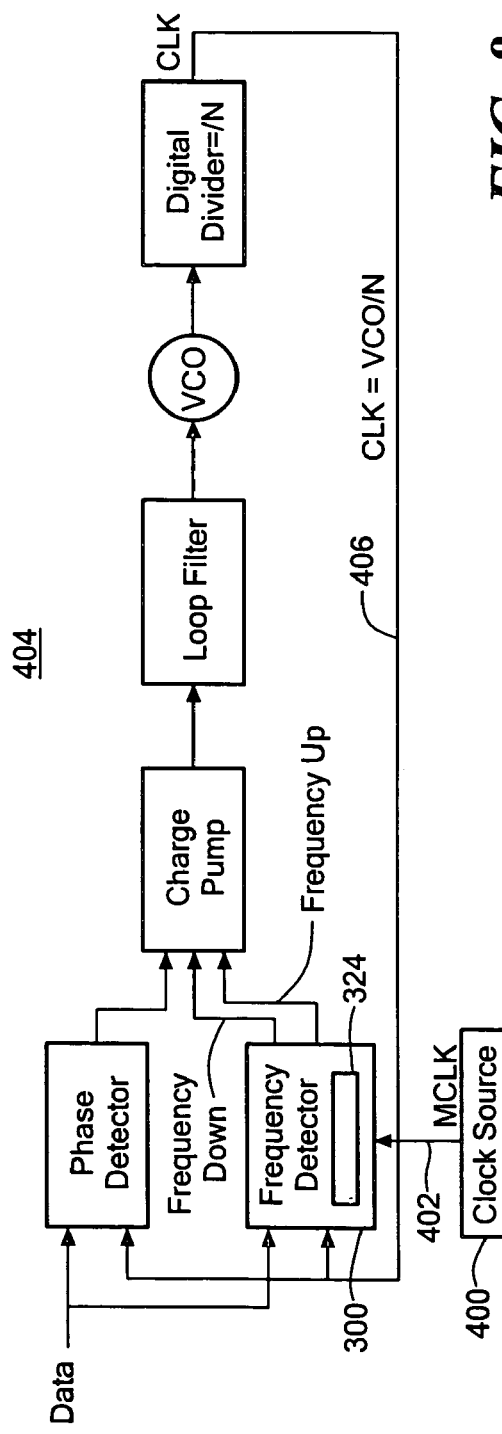
FIG. 8 is a schematic block diagram showing one embodiment of the step control system shown in FIG. 6 used to generate the step clock signal of this invention.

The step clock signal generated by step control system 324 described above may be generated by a system clock, such as system clock 400, FIG. 8. System clock 400 generates a step clock signal on line 402 which drives the step control system 324 of RFD system 300. As discussed above, RFD system 300 is typically employed in FLL loop circuit 404. In this design, the step clock signal on line 402 is completely independent of the recovered clock signal, e.g., VCO/N, on line 406.

Figure 9:
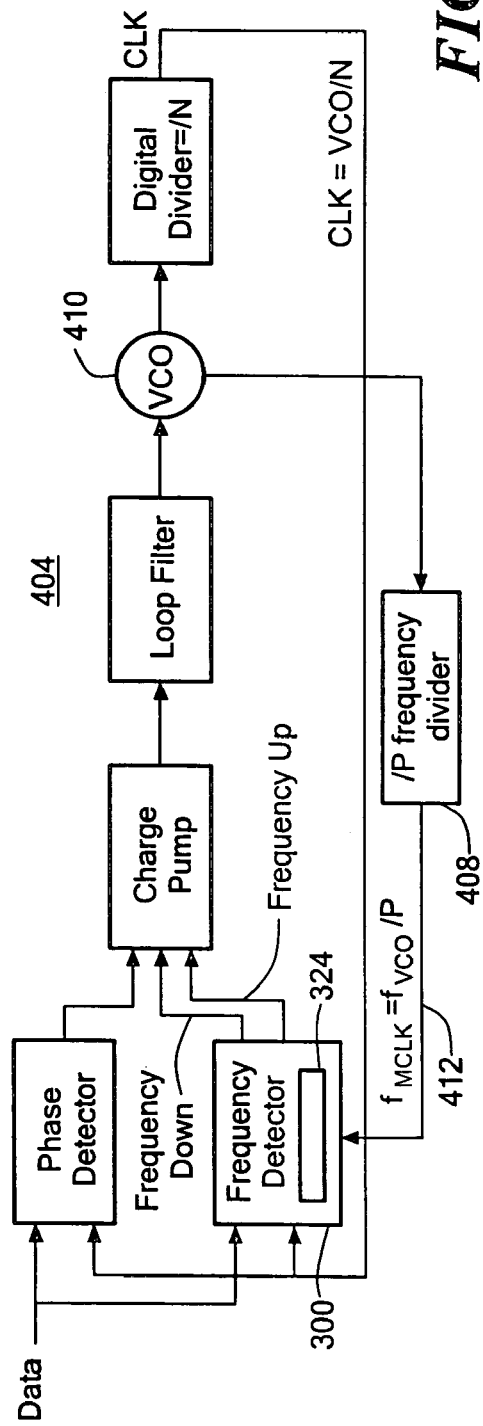
FIG. 9 is a schematic block diagram of another embodiment of the step control system shown in FIG. 6 used to generate the step clock signal of this invention.

The step clock signal may also be generated by frequency divider circuit 408, FIG. 9, connected to voltage control oscillator 410 of phase lock loop circuit 404. In this design, frequency divider circuit 408 generates a step clock signal on line 412 as a function of the frequency of voltage control oscillator 410 divided by a predetermined number (P), e.g., 256 or 128. In this design, the frequency of the step clock signal on line 412 is equal to $f_{vco/p}$, where $f_{vco}$ is the frequency of VCO 410. In this design, P can be set as needed to increase or decrease the period of a step clock signal on line 412, which, as described above, is used to generate frequency up and frequency down signals having pulse widths equal to the period of the step clock signal.

Figure 10:
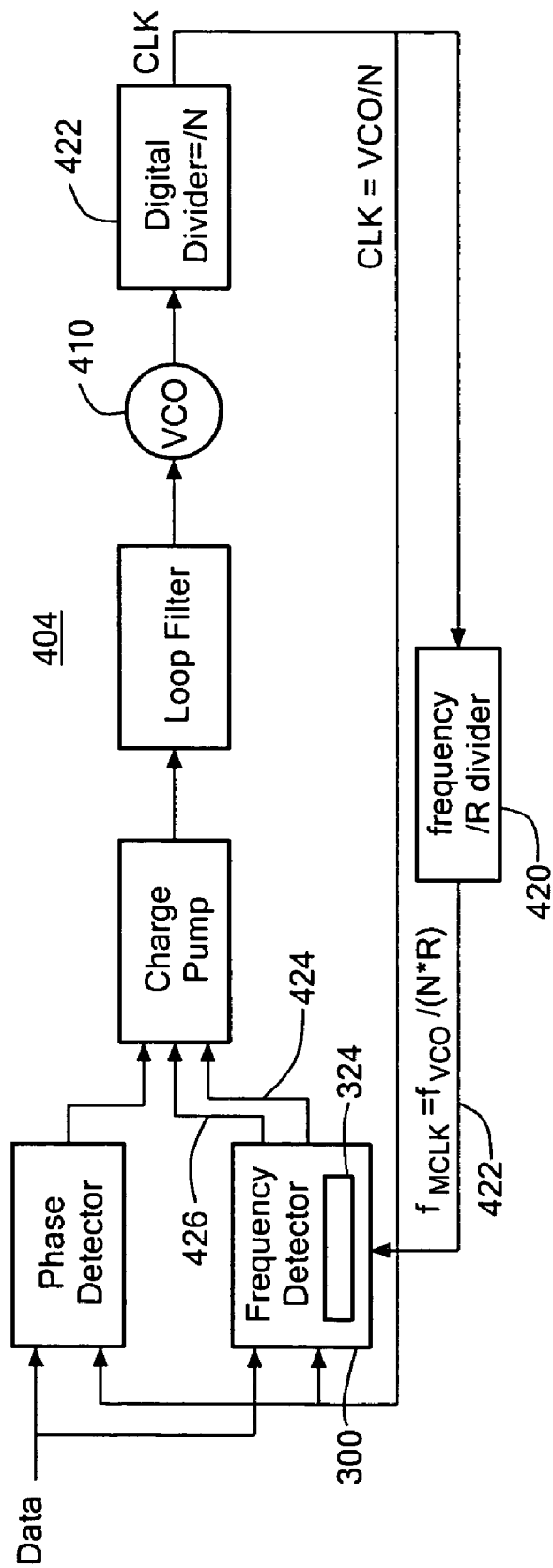
FIG. 10 is a schematic block diagram of yet another embodiment of the step control system in FIG. 6 used to generate the step clock signal of this invention.

In yet another design, the step clock signal may be generated by frequency divider circuit 420, FIG. 10 which is connected to digital divider circuit 422 of phase/frequency lock loop circuit 404. In this design, frequency divider circuit 420 is configured to generate a step clock signal on line 422 which is a function of the frequency of voltage control oscillator 410 divided by N times a predetermined number R, e.g., $f_{vco}/(N \times R)$, where $f_{vco}$ is the frequency of VCO 410 and R is a predetermined number, such as 128 or 256. Increasing R increases the pulse width of the frequency up signals produced by RFD system 300 on line 424 and the frequency down signals on line 426.

Figure 11:
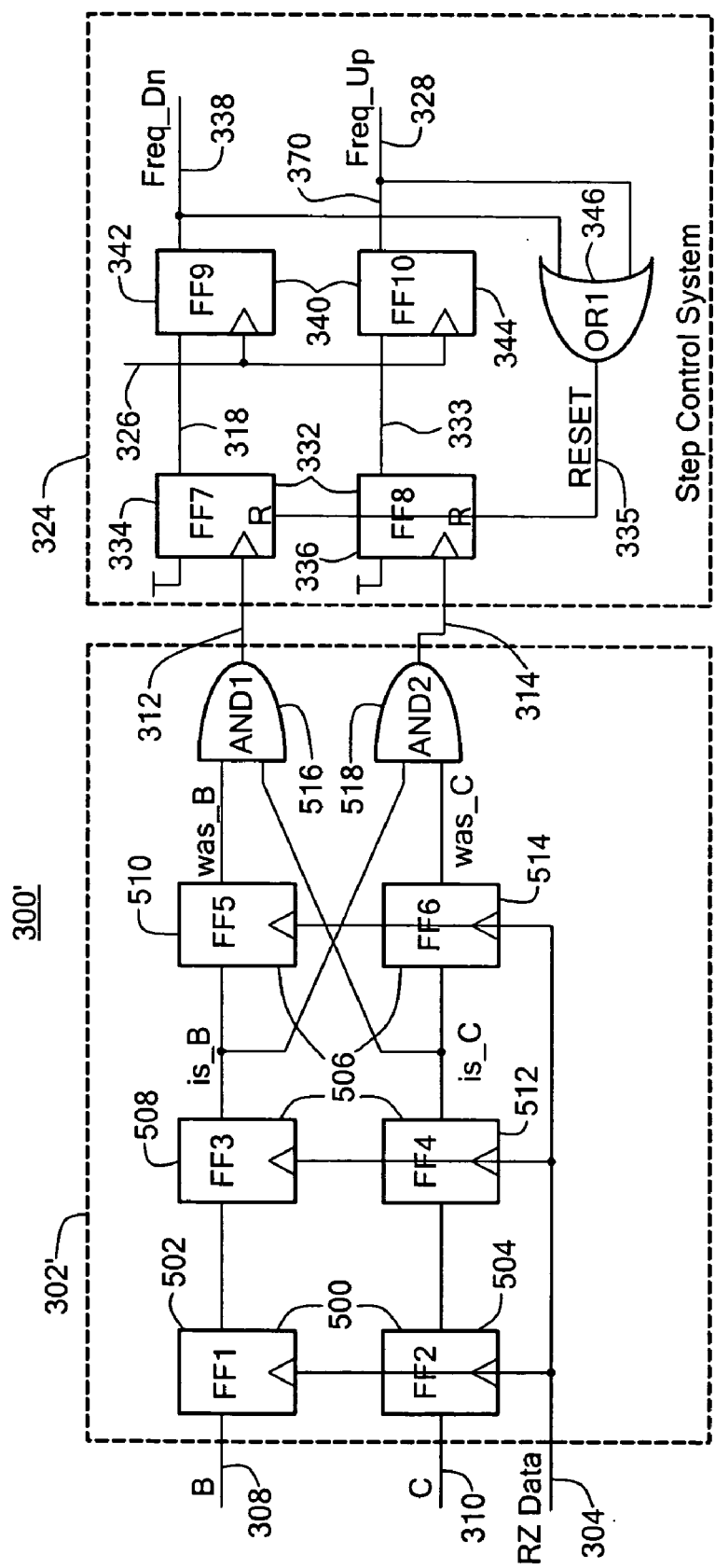
FIG. 11 is a schematic block diagram of another embodiment of the rotational frequency detector system in accordance with the subject invention.
Figure 12:
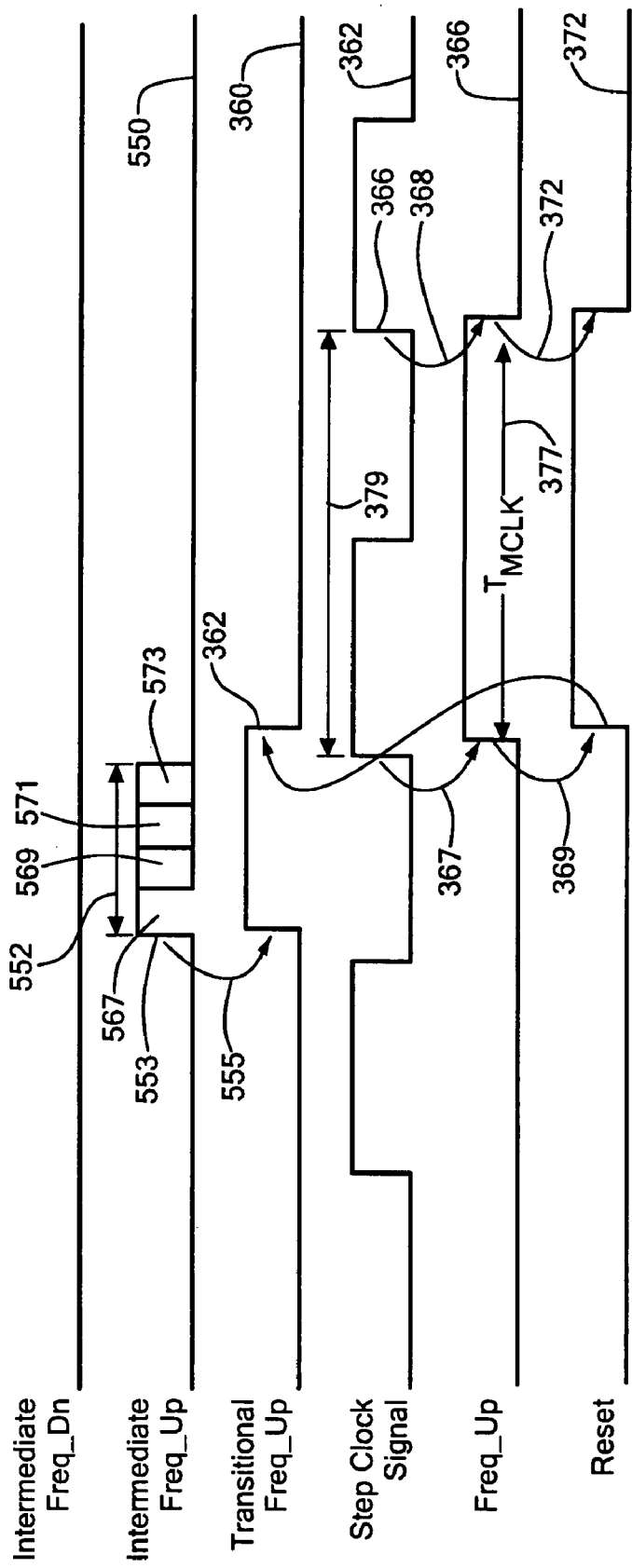
FIG. 12 is a timing diagram of the rotational frequency detector system shown in FIG. 11.

Rotational frequency detector system 300', FIG. 11, where like parts have been given like numbers, of this invention includes step control system 324 as described above. However, in this design rotational frequency detector 302'is responsive to only input data on line 304 which is used to sample the B-quadrant clock signal on line 308 and the C-quadrant clock signal on line 310. In this design, first plurality of storage devices 500 (e.g., D-type flip-flop 502 and 504) store and propagate the value of the B-quadrant clock signal on line 308 and the C-quadrant clock signal on line 310 based on transitions of the data signal on line 304, similarly as described as above in reference to FIGS. 3 and 4. Second plurality of storage devices 506, e.g., flip-flops 508, 510, 512, and 514 are clocked and propagated by rising transitions of the input RZ data on line 304 (or equivalently by rising and falling edges of input NRZ data). Indicator circuits 516 and 518 (e.g., AND gates) enable the generation of intermediate frequency up signals on line 314 and intermediate frequency down signals on line 312. However, unlike the prior art RFD 44 described above, RFD 302'of this invention generates intermediate frequency up signals on line 314 and intermediate frequency down signals on line 312 which have pulse widths equal to the number of consecutive 1's or 0 present in the input data on line 304. For example, intermediate frequency up signal 550, FIG. 12, where like parts have been given like numbers, has a pulse width, indicated by arrow 552, which is equal to the number of consecutive 1's or 0's in the data signal. In this example the data has four consecutive 1's (although in operation the number of 1's or 0's is unknown), indicated at 567, 569, 571 and 573. However, because step control system 324, FIG. 11, only relies on the first rising transition 553 of intermediate frequency up signal 550 to generate transitional frequency up signal 360, as indicated by arrow 555, the number of consecutive 1's or 0's in the data signal on line 304 is not important. Step clock signal 326 then clocks and generates frequency up signal 366 with a pulse width equal to one period of step clock signal 362, as described above with reference to FIGS. 6 and 7. Similarly, frequency down signals produced by RFD system 300'have pulse widths which are equal to step clock signal 362.

Figure 13:
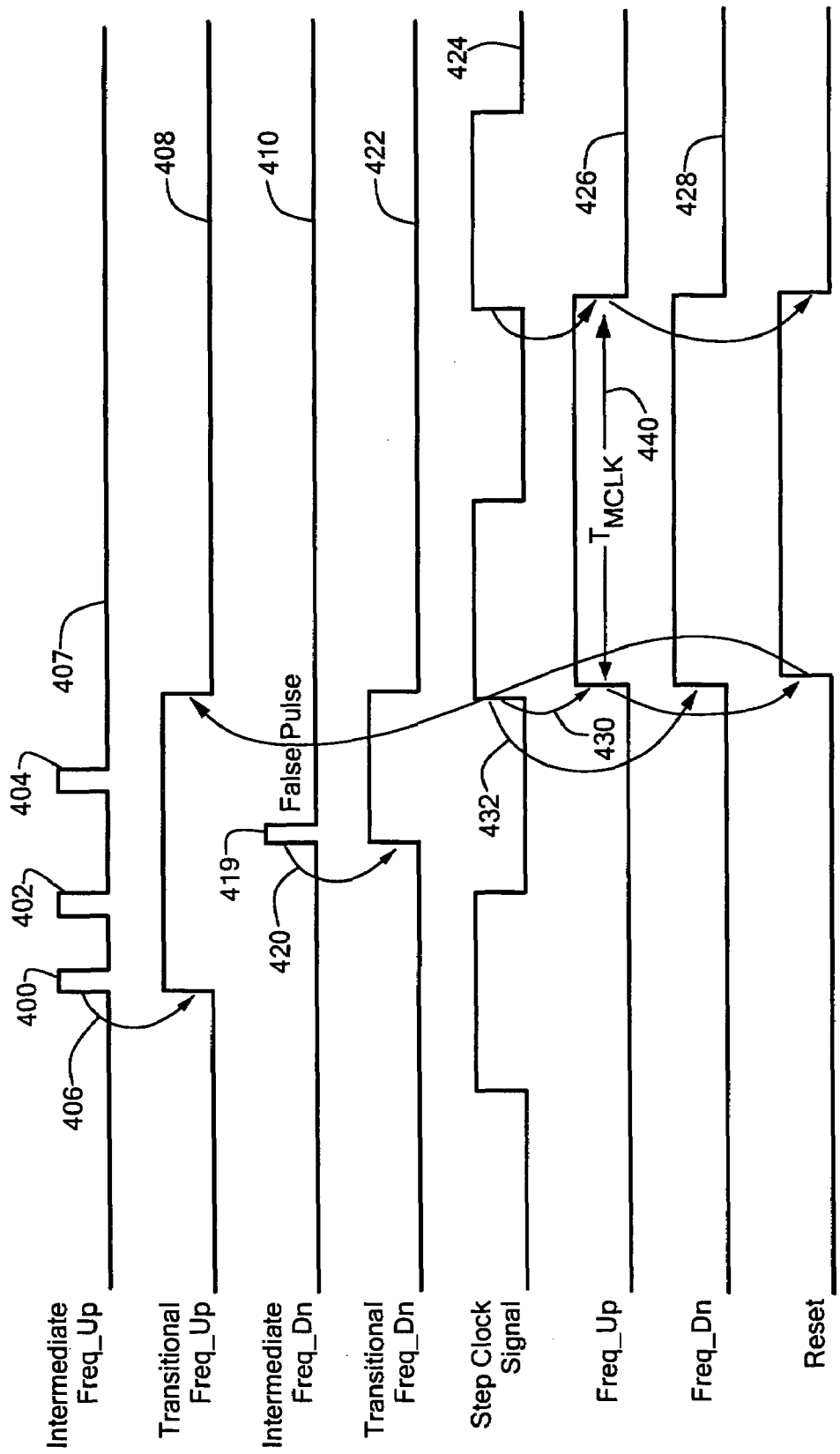
FIG. 13 is a timing diagram of the rotational frequency detector system shown in FIG. 11 showing the generation of a false intermediate frequency down pulse.

As discussed above, for certain normalized frequency differences prior art RFD 44, FIG. 3 generates some false pulses as shown in FIG. 5C. These false pulses are not a problem when operating within the operating range of prior art RFD 44, e.g., between −37% and +50% because there are more valid pulses than invalid pulses. Similarly, RFD system 300 and 300', FIGS. 6 and 11 of this invention may also generate some false intermediate frequency up pulses on line 314 and intermediate frequency down pulses on line 312. For example, as shown in FIG. 13, RFD system 300', FIG. 11 may generate three valid intermediate frequency up pulses 400, 402, and 404 on line 314 and one false intermediate frequency down pulse on line 312. RFD 300'utilizes the rising edge of intermediate frequency up signal 407, indicated by arrow 406, FIG. 13, to clock a logic one into storage device 336 (FF8) and appears as transitional frequency up signal 408, FIG. 13 on line 333, FIG. 11. Subsequent pulses of intermediate frequency up signal 407 are ignored because transitional frequency up signal 408 is already high. A rising edge on intermediate frequency down signal 410, indicated by arrow 420, clocks a logic high into storage device 334 (FF7) and appears as transitional frequency down signal 422 on line 318. At this point both transitional frequency up signal 408 on line 333 and transitional frequency down signal 422 on line 318 are both a logic high. On the next rising edge of step clock signal 424 on line 326 both frequency up signal 426 on line 328 and the frequency down signal 428 on line 338 go to a logic high, as indicated by arrows 430 and 432. Both frequency up signal 426 and frequency down signal 428 remain at a logic high for one period of step clock signal 424, indicated by arrow 440. Therefore, three pulses of intermediate frequency up signal 407 e.g. pulses 400, 402, and 404 and one pulse of intermediate frequency down signal 410, e.g., pulse 419, lead to the same effect by producing one frequency up signal 426 and one frequency down signal 428, both having a pulse width equal to one period of step clock signal 424. Therefore, at this point there are three valid intermediate frequency up pulses (e.g., pulses 400, 402, and 404) and one false intermediate frequency down pulse (e.g., pulse 419) giving a net of two valid pulses. However, this has led to one frequency up pulse 426 and one frequency down pulse 428 yielding a net zero change. Accordingly any false pulses that occur at intermediate frequency up signal on line 314 or intermediate frequency down signal on line 312 have a significant effect on the number of frequency up pulses produced on line 328 and the frequency down pulses produced on line 338 by RFD system 300', FIG. 11 (as well as system RFD system 300, FIG. 6).

Figure 14:
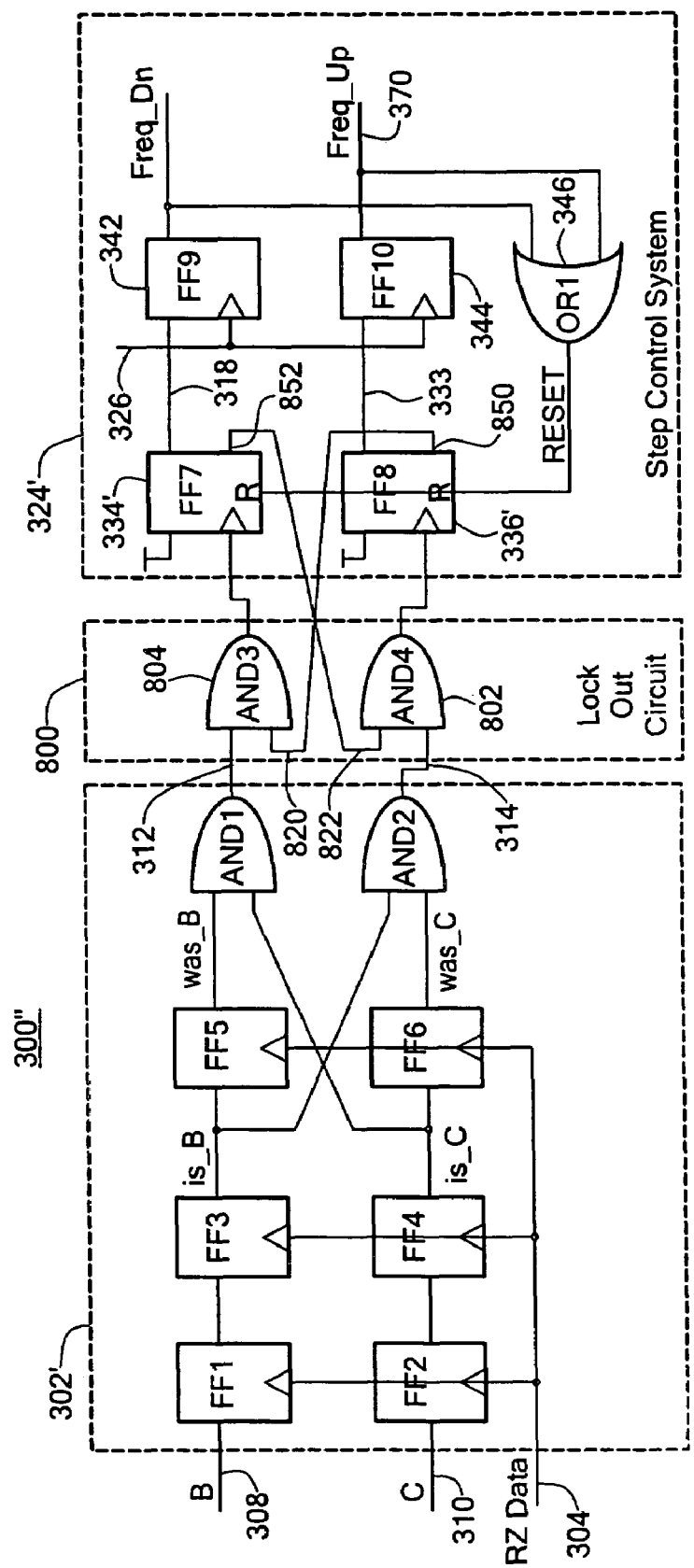
FIG. 14 is a schematic block diagram showing one embodiment of the rotational frequency detector system of this invention designed to remove false frequency up and frequency down signals.

In order to overcome the problems associated with the false intermediate frequency up or intermediate frequency down pulses, RFD system 300", FIG. 14, where like parts have been given like numbers, includes lockout circuit 800 for removing false intermediate frequency up pulses on line 314 and false intermediate frequency down pulses on line 312. When an intermediate frequency up pulse on line 314 goes high it will clock a logic high as a transitional frequency up signal on line 333. The QB output of storage device 336 (FF8), indicated at 850, will be logic low which is an input to gating device 804 (e.g. AND3 gate) on line 820 which forces the output of gating device 804 (AND3) to a logic low which prevents any false intermediate frequency down pulses on line 312 from propagating into storage device 334 (FF7). Similarly, when an intermediate frequency down pulse on line 312 goes high it will clock a logic high as transitional frequency down signal on line 318. The QB output from storage device 334 (FF7), indicated at 852 will be a logic low which is an input to gating device 802 (AND4) which forces the output of gating device 802 (AND4) to a logic low which prevents any false intermediate frequency up pulses on line 314 from propagating into storage device 336 (FF8).

Figure 15:
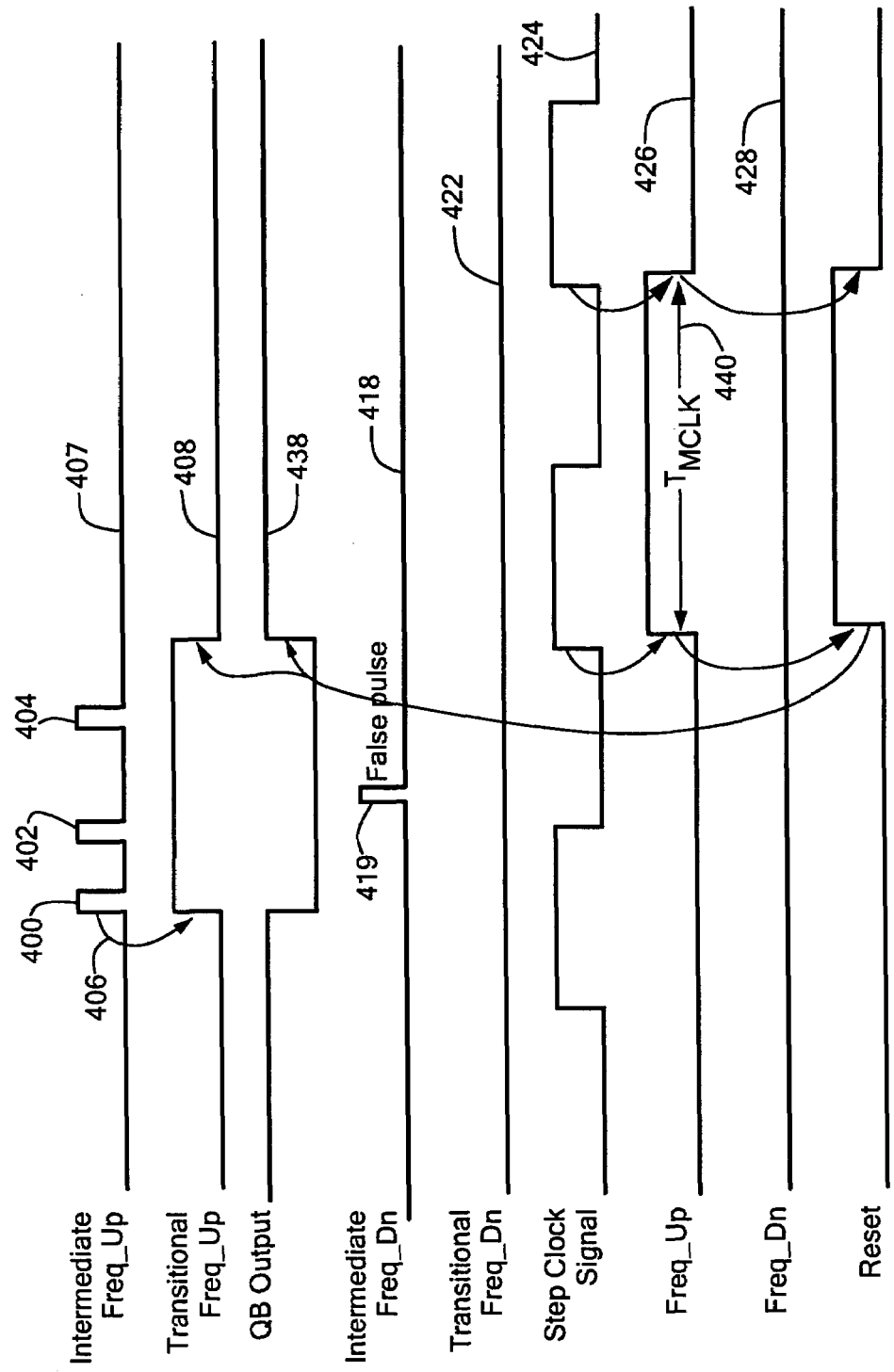
FIG. 15 is a timing diagram showing the removal of a false frequency down pulse by the rotational frequency detector system shown in FIG. 14.

FIG. 15, where like parts are given like numbers, shows the timing diagram for RFD system 300", FIG. 14. As can be seen in this example, QB output signal 438 generated by storage device 336 (FF8) eliminates the generation of transitional frequency down signal 422. The result is that the corresponding frequency down signal 428 is also eliminated.

Figure 16:
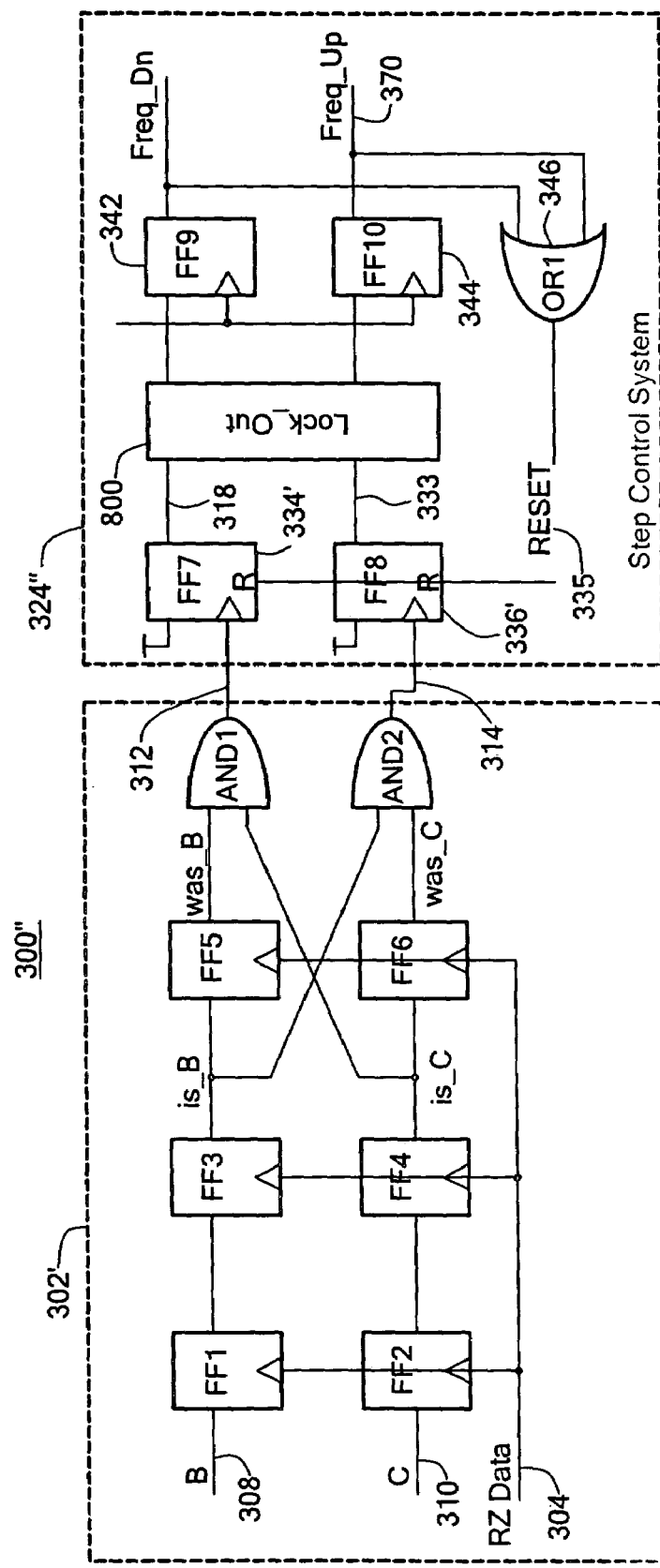
FIG. 16 is a schematic block diagram showing another embodiment of the rotational frequency detector system of this invention designed to remove false frequency up and frequency down signals.

RFD system 300", FIG. 16, where like parts have been given like numbers, shows another embodiment of lockout circuit 800 which removes false intermediate frequency up pulses on line 314 and false intermediate frequency down pulses on line 312. In this example, lockout circuit 800 is placed between storage devices 334 and 336 and storage devices 342 and 344 to remove false transitional frequency down signals on line 318 and false transitional frequency up signals on line 333.

Figure 17:
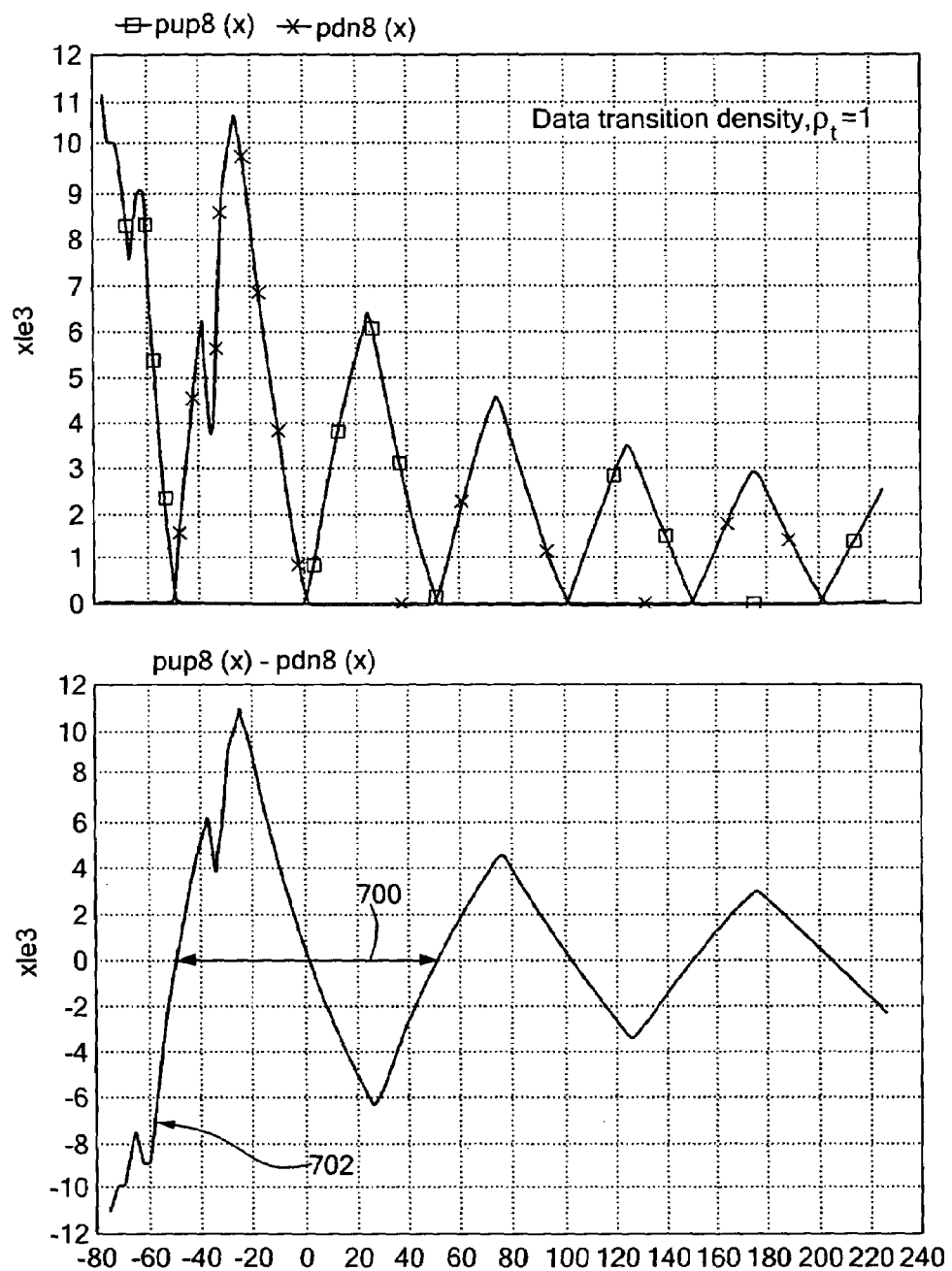
FIGS. 17 and 18 are graphs showing the transfer function of the rotational frequency detector system shown in FIGS. 14 and 16.
Figure 18:
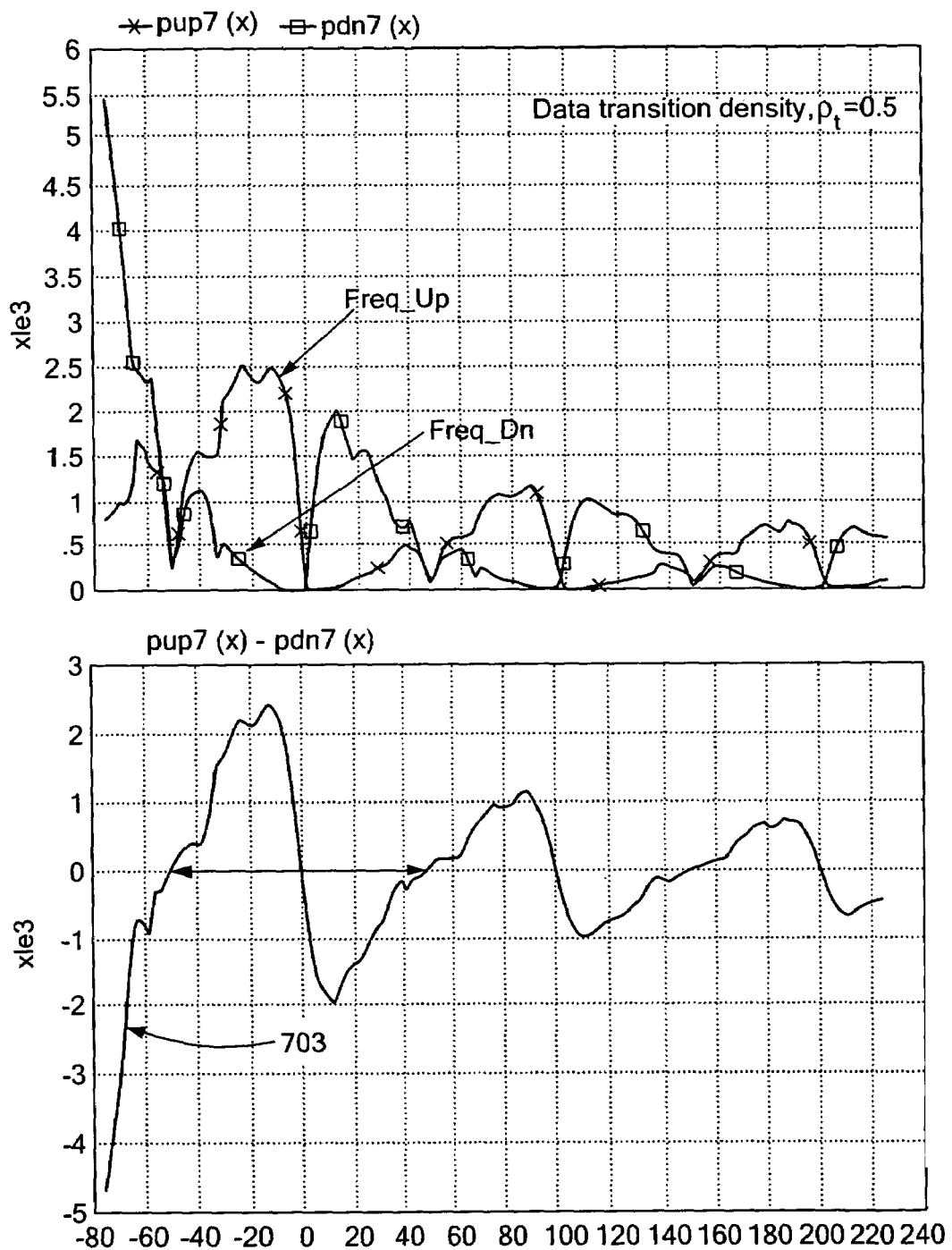

FIGS. 17 and 18 show the transfer function for RFD system 300", FIGS. 14 and 16. In operation, the normalized frequency error of RFD system 300" is between about −50% and +50% for both a maximum data transition density ($\rho_t$) equal to 1 as indicated by arrow 700, and for a transition density ($\rho_t$) equal to 0.5 (random data), as indicated by arrow 704. This is in contrast to the operating range −37% to +50% of prior art RFD 44, FIG. 3, as shown by transfer functions in FIGS. 5B and 5D. Moreover, when the normalized frequency errors are less than −50%, RFD system 300", FIGS. 14 and 16 of this invention has a non-zero output, as indicated by arrow 702, FIG. 17 and arrow 703, FIG. 18. This prevents a false declaration of a lock.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A rotational frequency detector system comprising:
   a rotational frequency detector responsive to a data signal and a clock signal, said rotational frequency detector configured to compare the frequency of said clock signal to the frequency of said data signal to define frequency up and/or frequency down signals that adjust the frequency of said clock signal to be equal to the frequency of said data signal; and
   a step control system responsive to said rotational frequency detector and a step clock signal, said step control system configured to define predetermined pulse widths for and provide said frequency up and frequency down signals, said predetermined pulse widths of said frequency up and said frequency down signals equal to the period and/or a multiple of periods of said step clock signal.

2. The system of claim 1 in which said step control system includes a step clock for generating said step clock signal independent of said clock signal.

3. The system of claim 1 in which said step control system includes a frequency divider circuit connected to the output of a voltage controlled oscillator of a phase lock loop circuit and/or frequency locked loop circuit to generate said step clock signal as a function of the frequency of the controlled voltage oscillator divided by a predetermined number.

4. The system of claim 1 in which said step control system includes a frequency divider circuit connected to a digital divider circuit of a phase lock loop circuit and/or a frequency lock loop circuit to generate said step clock signal as a function of the frequency of a voltage controlled oscillator divided by N times a predetermined number.

5. The system of claim 1 in which said rotational frequency detector includes a first plurality of storage devices clocked by a transition of said data signal, a second plurality of storage devices clocked by a transition of said clock signal, and a detection circuit configured to generate intermediate frequency up and frequency down signals.

6. The system of claim 5 in which said plurality of storage devices includes D-type flip-flops.

7. The system of claim 5 in which said rotational frequency detector includes a plurality of AND gates.

8. The system of claim 5 in which said step control system includes a plurality of storage devices and a detection circuit responsive to said intermediate frequency up and intermediate frequency down signals and said step clock signal configured to generate said frequency up signals and said frequency down signals having said predetermined pulse widths.

9. The system of claim 8 in which one or more of said plurality of storage devices are clocked by said intermediate frequency up and intermediate frequency down signals.

10. The system of claim 8 in which one or more of said plurality of storage devices are clocked by said step clock signal.

11. The system of claim 8 in which said storage devices include D-type flip-flops.

12. The system of claim 8 in which said detection circuit includes an OR gate.

13. The system of claim 1 in which said rotational frequency detector includes a first plurality of storage devices and a second plurality of storage devices clocked by a transition of said data signal and a detection circuit configured to generate intermediate frequency up and frequency down signals.

14. The system of claim 13 in which said step control system includes a plurality of storage devices and a detection circuit responsive to said intermediate frequency up signal and frequency down signals and said step clock signal configured to generate said frequency up and frequency down signals having a said predetermined pulse widths.

15. The system of claim 14 in which one or more of said plurality of storage devices are clocked by said intermediate frequency up and intermediate frequency down signals.

16. The system of claim 14 in which one or more of said plurality of storage devices are clocked by said step clock signal.

17. The system of claim 1 in which said step control system further includes a lock out circuit configured to remove false frequency up signals and false frequency down signals.

18. The system of claim 17 in which said lock out circuit includes a plurality of AND gates.

19. The system of claim 1 in which said rotational frequency detector system operates in a range of about −50% to +50% of the normalized frequency error of said rotational frequency detector.

20. The system of claim 1 in which said rotational frequency detector system generates a non-zero output below −50% of the normalized frequency error of said rotational frequency detector.

21. A rotational frequency detector system with independent clock control comprising:
a rotational frequency detector, responsive to a data signal and a clock signal, configured to compare the frequency of said clock signal to the frequency of said data signal to define frequency up and frequency down signals that adjust the frequency of said clock signal to be equal to the frequency of said data signal; and
a step control system, responsive to said rotational frequency detector and a step clock signal, configured to define predetermined pulse widths for and provide said frequency up and said frequency down signals which are independent of said clock signal, said predetermined pulse widths of said frequency up and said frequency down signals equal to the period and/or a multiple of periods of said step clock signal.

22. A rotational frequency detector system comprising:
a rotational frequency detector responsive to a data signal and a clock signal, said rotational frequency detector configured to compare the frequency of said clock signal to the frequency of said data signal to define frequency up and frequency down signals that adjust the frequency of said clock signal to be equal to the frequency of said data signal; and
a step control system, responsive to said rotational frequency detector, including a step clock configured to generate a step clock signal independent of said clock signal which defines pulse widths for and provides said frequency up and frequency down signals which are equal to the period of said step clock signal.

23. A rotational frequency detector system comprising:
a step control system responsive to a rotational frequency detector and a step clock signal configured to define and provide predetermined pulse widths for frequency up and frequency down signals which are equal to the period of said step clock signal.

* * * * *